(12) United States Patent
Park et al.

(10) Patent No.: US 10,964,909 B2
(45) Date of Patent: Mar. 30, 2021

(54) ORGANIC LIGHT EMITTING DIODE DISPLAY DEVICE HAVING A DAM FOR CONTROLLING FLOW OF ENCAPSULANT

(71) Applicant: LG Display Co., Ltd., Seoul (KR)

(72) Inventors: Sung-Jin Park, Gyeonggi-do (KR); Soon-Kwang Hong, Daegu (KR); Do-Hyung Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/833,308

(22) Filed: Dec. 6, 2017

(65) Prior Publication Data

US 2018/0097200 A1    Apr. 5, 2018

Related U.S. Application Data

(63) Continuation of application No. 15/174,058, filed on Jun. 6, 2016, which is a continuation of application No. 14/449,228, filed on Aug. 1, 2014, now Pat. No. 9,391,296.

(30) Foreign Application Priority Data

Aug. 30, 2013    (KR) .................. 10-2013-0104250

(51) Int. Cl.
*H01L 51/52*    (2006.01)
*H01L 27/32*    (2006.01)
*H01L 51/56*    (2006.01)
*H01L 27/12*    (2006.01)

(52) U.S. Cl.
CPC ...... *H01L 51/5253* (2013.01); *H01L 27/3246* (2013.01); *H01L 51/525* (2013.01); *H01L 51/56* (2013.01); *H01L 27/1248* (2013.01); *H01L 27/3248* (2013.01); *H01L 27/3258* (2013.01); *H01L 27/3262* (2013.01); *H01L 27/3276* (2013.01); *H01L 2227/323* (2013.01)

(58) Field of Classification Search
None
See application file for complete search history.

(56) References Cited

U.S. PATENT DOCUMENTS

| 7,088,418 | B1 | 8/2006 | Yamashita et al. |
| 2002/0078559 | A1 | 6/2002 | Buchwalter et al. |
| 2003/0164674 | A1 | 9/2003 | Imamura |
| 2005/0134170 | A1 | 6/2005 | Otani et al. |
| 2005/0155704 | A1 | 7/2005 | Yokajty et al. |

(Continued)

FOREIGN PATENT DOCUMENTS

| JP | 2012-3989 A | 1/2012 |
| KR | 10-2013-0015113 A | 2/2013 |

*Primary Examiner* — Erik Kielin
(74) *Attorney, Agent, or Firm* — Morgan, Lewis & Bockius LLP (57) ABSTRACT

An OLED display device and a method of fabricating the same are disclosed. The OLED display device includes a substrate including a display area provided with an organic light emitting element and a pad area provided with a plurality of pads, the pad area formed around the display area, an encapsulation layer formed on the substrate such that the encapsulation layer covers the organic light emitting element, and a dam formed between the display area and the pad area, the dam controlling flow of an organic film material constituting the encapsulation layer.

12 Claims, 10 Drawing Sheets

(56) References Cited

U.S. PATENT DOCUMENTS

| | | |
|---|---|---|
| 2008/0237895 A1 | 10/2008 | Saeki |
| 2009/0153042 A1* | 6/2009 | Izumi .................. H01L 27/3258 |
| | | 313/504 |
| 2010/0157412 A1* | 6/2010 | Lee .......................... G02F 1/167 |
| | | 359/296 |
| 2010/0244668 A1 | 9/2010 | Nakamura et al. |
| 2011/0084290 A1 | 4/2011 | Nakamura |
| 2011/0141717 A1* | 6/2011 | Yoshinaga .......... H01L 51/5253 |
| | | 362/97.1 |
| 2011/0151612 A1 | 6/2011 | Dings et al. |
| 2012/0091477 A1* | 4/2012 | Kim .................... H01L 51/5246 |
| | | 257/88 |
| 2013/0088675 A1 | 4/2013 | Ochiai et al. |
| 2013/0328480 A1 | 12/2013 | Joo et al. |
| 2014/0217371 A1 | 8/2014 | Kim et al. |
| 2015/0091030 A1 | 4/2015 | Lee et al. |

* cited by examiner

ORGANIC LIGHT EMITTING DIODE DISPLAY DEVICE HAVING A DAM FOR CONTROLLING FLOW OF ENCAPSULANT

This application is a continuation of U.S. patent application Ser. No. 15/174,058, filed on Jun. 6, 2016, which is a continuation of U.S. patent application Ser. No. 14/449,228, filed on Aug. 1, 2014, which claims the benefit of Korean Patent Application No. 10-2013-0104250, filed on Aug. 30, 2013, the entirety of each of which is hereby incorporated by reference for all purposes as if fully set forth herein.

BACKGROUND OF THE INVENTION

Field of the Invention

The present invention relates to an OLED display device and a method of fabricating the same.

Discussion of the Related Art

In recent years, organic light emitting diode (OLED) display devices are attracting considerable attention as flat panel display devices, which solve high weight and high volume, which are problems of cathode ray tubes (CRTs).

Such an OLED display device includes an anode, a cathode, and an organic semiconductor layer formed between the anode and the cathode. The organic semiconductor layer includes a hole injection layer, a hole transport layer, a light-emitting layer, an electron transport layer and an electron injection layer.

In this regard, OLED display devices are disadvantageously vulnerable to deterioration caused by internal factors, for example, deterioration of electrodes and the light emitting layer by oxygen and deterioration caused by light emitting layer-interface reaction and deterioration caused by external factors such as exterior moisture, oxygen and UV. Accordingly, packaging and encapsulation of OLED display devices are considerably important.

Figure 1:
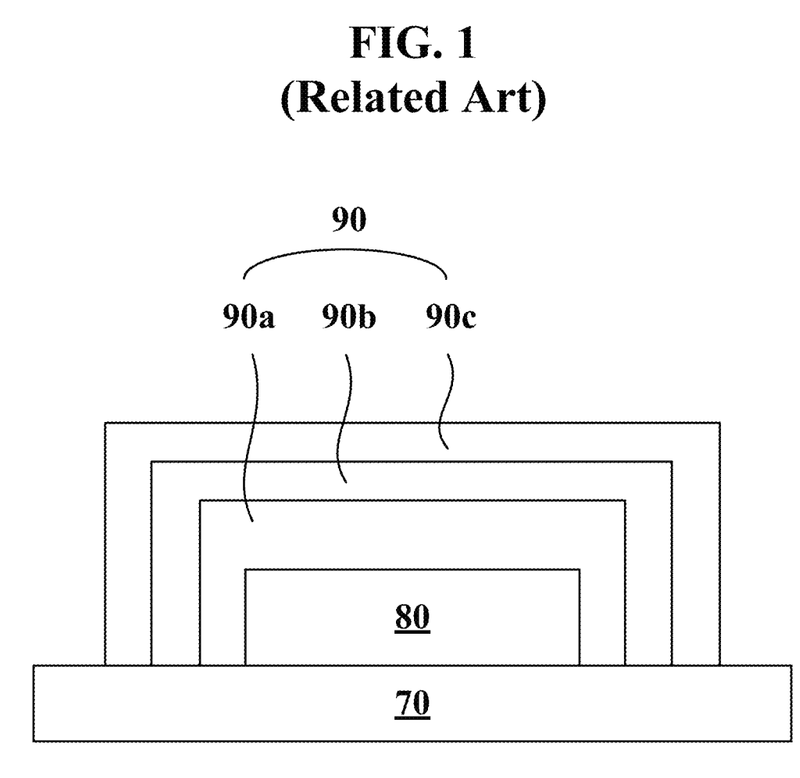
FIG. 1 is a sectional view illustrating a related art method for encapsulating an OLED display device.

FIG. 1 is a sectional view illustrating a related art method for encapsulating an OLED display device.

With reference to FIG. 1, in accordance with the conventional encapsulation method, an encapsulation layer 90 having a plurality of layers including a first inorganic film 90a, an organic film 90b and a second inorganic film 90c is formed on a substrate 70 provided with an organic light emitting diode 80 for encapsulation.

Figure 2:
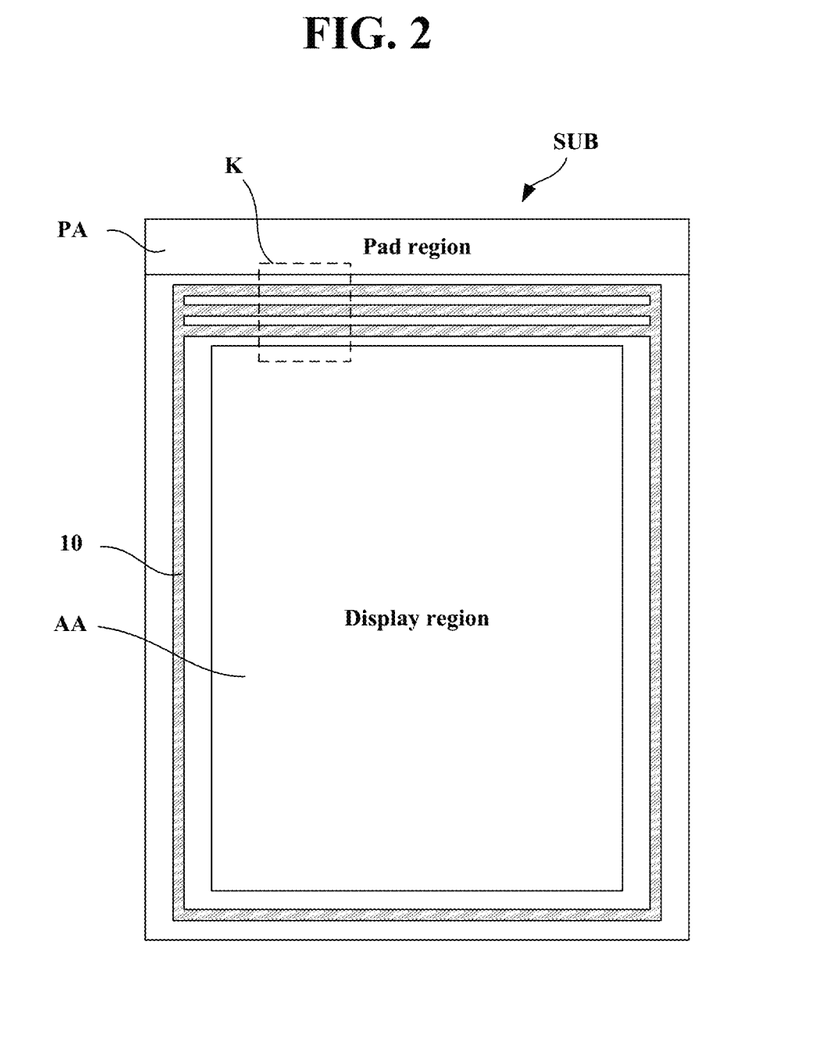
FIG. 2 is a plan view illustrating an OLED display device according to an embodiment of the present invention.

The organic film 90b constituting the encapsulation layer 90 is made of a polymer and is formed by applying a liquid polymer to the substrate 70 and then curing the same. The organic film 90b is flowable until it is cured and the liquid polymer constituting the organic film 90b advantageously permeates a pad region formed at the periphery of the substrate 70. FIG. 2 is an image showing a defect resulting from permeation of the liquid polymer into the pad region of a driving IC formed at the periphery of the substrate 70. The liquid polymer permeated into the pad region causes driving defects or lighting inspection defects.

SUMMARY OF THE INVENTION

Accordingly, the present invention is directed to an OLED display device and a method of fabricating the same that substantially obviate one or more problems due to limitations and disadvantages of the related art.

An object of the present invention is to provide an OLED display device which includes at least one dam at the periphery of a substrate to prevent a liquid polymer constituting an organic film from permeating a pad area during production of the organic film constituting an encapsulation layer, and a method of fabricating the same.

Additional features and advantages of the invention will be set forth in part in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an OLED display device includes a substrate including a display area provided with an organic light emitting element and a pad area provided with a plurality of pads, the pad area formed around the display area, an encapsulation layer formed on the substrate such that the encapsulation layer covers the organic light emitting element, and a dam formed between the display area and the pad area, the dam controlling flow of an organic film material constituting the encapsulation layer.

In another aspect, a method for manufacturing an OLED display device includes forming an organic light emitting element in a display area on a substrate, forming a plurality of dams between the display area and a pad area provided with a plurality of pads, and forming an encapsulation layer on the substrate such that the encapsulation layer covers the organic light emitting element, wherein the dam controls flow of an organic film material constituting the encapsulation layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an OLED display device and a method of fabricating the same according to an embodiment of the present invention will be described in detail with reference to the annexed drawings.

FIG. 2 is a plan view illustrating an OLED display device according to an embodiment of the present invention.

With reference to FIG. 2, the OLED display device according to the embodiment includes a substrate SUB including a display area AA provided with an organic light emitting element and a pad area PA provided with a plurality of pads 30 (see FIG. 6), an encapsulation layer 20 (see FIG. 3) formed on the substrate SUB such that the encapsulation layer 20 covers the organic light emitting element formed in the display area AA, and a dam 10 being formed between the display area AA and the pad area PA and controlling flowability of a material for an organic film 24 constituting the encapsulation layer 20.

The dam 10 functions to prevent a liquid polymer constituting the organic film 24 from permeating the pad area AA during production of the organic film 24 constituting the encapsulation layer 20. For this purpose, the dam 10 may be formed only between the display area AA and the pad area PA and is preferably formed to surround the periphery of the display area AA.

As shown in FIG. 2, the dam 10 may include a plurality of dams formed at a side of the substrate SUB provided with the pad area PA. Specifically, the dam 10 may include a plurality of dams spaced from one another by a predetermined distance at the side of the substrate SUB provided with the pad area PA. As a result, the dam 10 easily prevents the liquid polymer from permeating the pad area PA. Meanwhile, the dam 10 may include a plurality of dams formed at another side of the substrate SUB provided with the pad area PA.

As such, the liquid polymer can be prevented from permeating the pad area PA during formation of the organic film 24 constituting the encapsulation layer 20 by forming the dam 10 at the periphery of the substrate SUB. The dam 10 will be described in more detail later.

Hereinafter, the organic light emitting element formed in display area AA will be described in detail.

Figure 3:
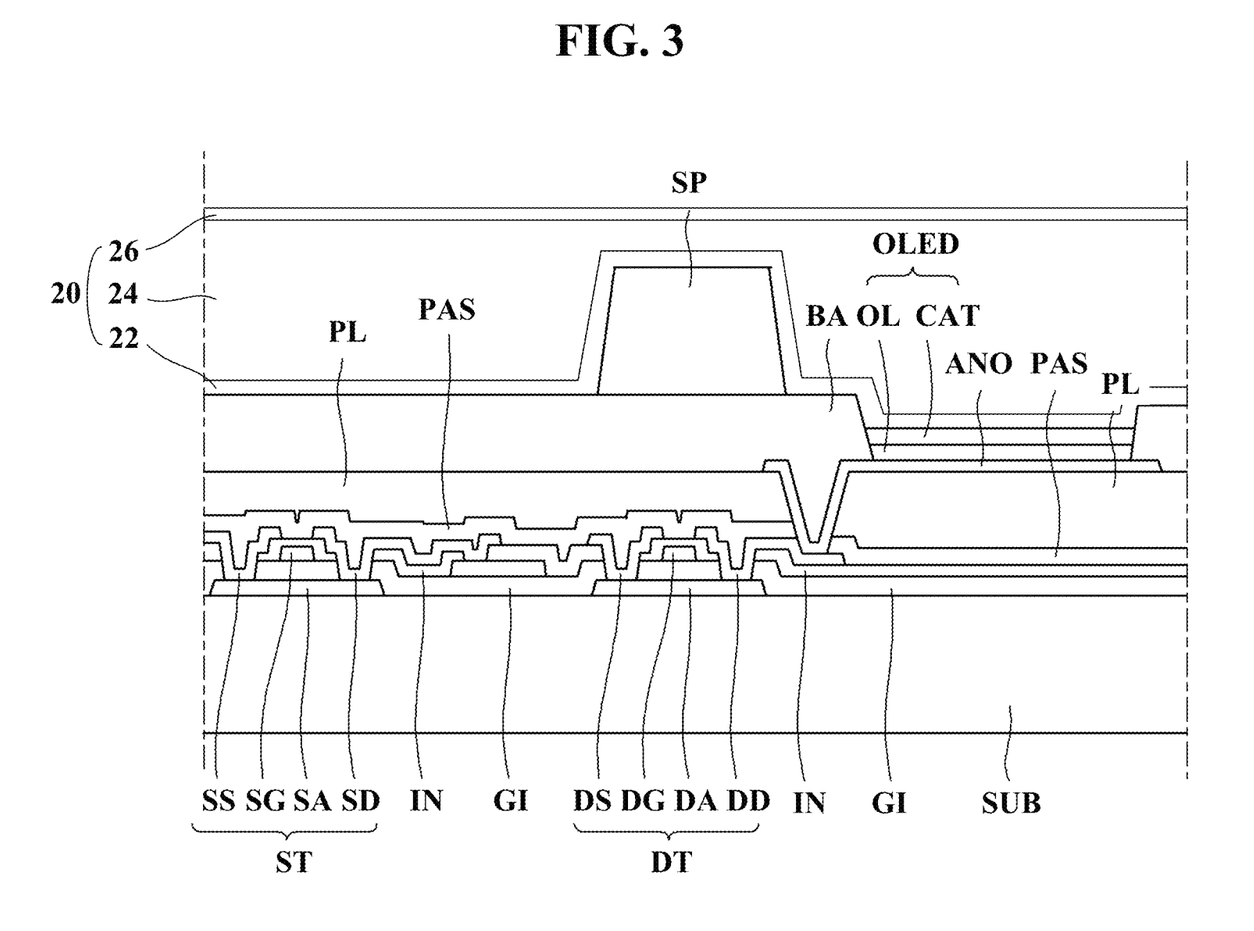
FIG. 3 is a sectional view illustrating the display area AA shown in FIG. 2.

FIG. 3 is a sectional view illustrating the display area AA shown in FIG. 2.

With reference to FIG. 3, the organic light emitting element formed in the display area AA includes a plurality of thin film transistors (hereinafter, referred to as "TFTs", ST and DT) formed on the substrate SUB and a plurality of OLEDs being driven while being connected to the TFTs (ST and DT). The TFTs (ST and DT) include a switching TFT ST and a driving TFT DT.

The switching TFT ST is formed at the intersection between a gate line (not shown) and a data line (not shown) and is connected thereto. The switching TFT ST functions to select a pixel. For this purpose, the switching TFT ST includes a gate electrode SG branching from the gate line, a semiconductor layer SA, a source electrode SS and a drain electrode SD.

The driving TFT DT functions to drive an anode ANO disposed at the pixel selected by the switching TFT ST. For this purpose, the driving TFT DT includes a gate electrode DG connected to the drain electrode SD of the switching TFT ST, a semiconductor layer DA, a source electrode DS connected to the driving current supply line (not shown) and a drain electrode DD. The drain electrode DD of the driving TFT DT is connected to the anode ANO of the OLED.

FIG. 3 illustrates, for example, a top gate TFT. In this case, a semiconductor layer SA of a switching TFT ST and a semiconductor layer DA of a driving TFT DT are formed on a substrate SUB, and a gate insulation film GI is formed on the semiconductor layers SA and DA. In addition, gate electrodes SG and DG are formed on the gate insulation film GI such that the gate electrodes SG and DG overlap the centers of the semiconductor layers SA and DA, respectively. In addition, source electrodes SS and DS are respectively connected to drain electrodes SD and DD through contact holes at both sides of the semiconductor layers SA and DA. The source electrodes SS and DS and the drain electrodes SD and DD are formed on an interlayer insulating film IN covering the gate electrodes SG and DG.

The substrate SUB provided with the switching TFT ST and the driving TFT DT are coated with a passivation film PAS and a planarization film PL. A plurality of banks BAs dividing a plurality of light emitting regions is formed on the substrate SUB including the planarization film PL. In addition, at least one spacer SP is further formed on at least one of the banks BAs.

An anode ANO contacting the drain electrode DD of the driving TFT DT through the contact hole is formed in each light emitting region. An organic semiconductor layer OL is formed on the anode ANO and a cathode CAT is stacked on the organic semiconductor layer OL. The organic semiconductor layer OL includes a hole injection layer, a hole transport layer, a light emitting layer, an electron transport layer and an electron injection layer.

The organic light emitting element on the substrate SUB including the banks BAs and the spacer SP is encapsulated by forming an encapsulation layer 20 having a plurality of layers including a first inorganic film 22, an organic film 24 and a second inorganic film 26. The encapsulation layer 20 is bonded to the encapsulation substrate (not shown) via an adhesion layer (not shown) interposed between the encapsulation layer 20 and the encapsulation substrate.

The organic film 24 provided in the encapsulation layer 20 is made of a polymer and is formed by applying a liquid polymer to the substrate SUB and curing the same. The polymer having a liquid phase upon formation of the organic film 24 is controlled by the dam 10 as shown in FIG. 2 and thus does not permeate the pad area PA.

Figure 4:
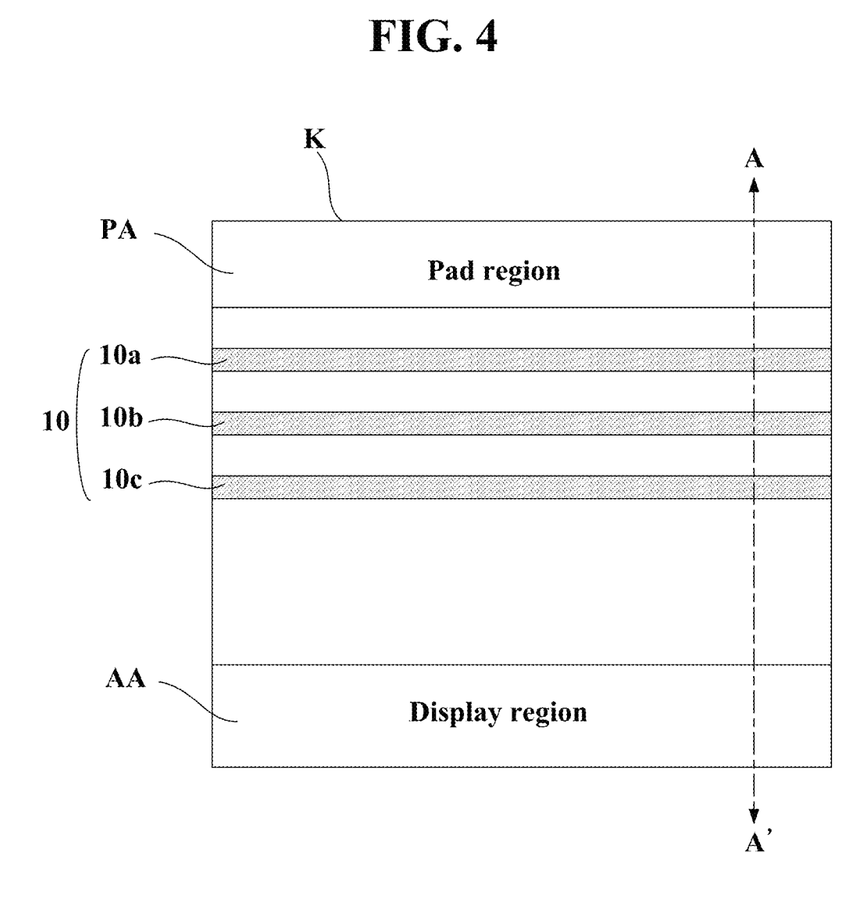
FIG. 4 is an enlarged view illustrating the region "K" shown in FIG. 2.
Figure 5:
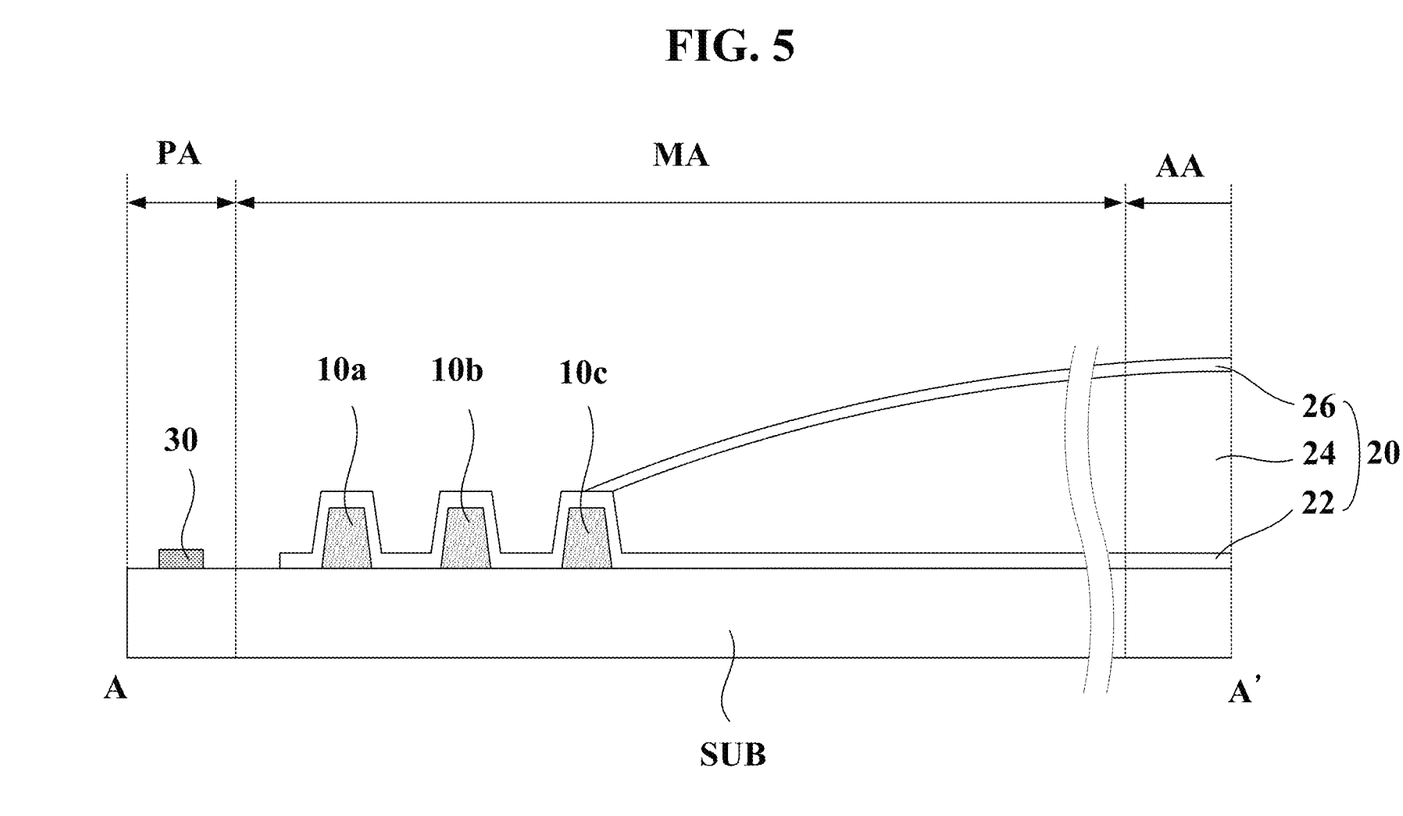
FIG. 5 is a sectional view taken along line A-A' of FIG. 4.

FIG. 4 is an enlarged view illustrating the region "K" shown in FIG. 2. FIG. 5 is a sectional view taken along line A-A' of FIG. 4.

With reference to FIGS. 4 and 5, a plurality of pads 30 are formed in the pad area PA. The pads 30 may be connected to a circuit film (not shown) or to a driving IC. The pad is schematically shown in FIG. 5, but the structure of the pad 30 is similar to that described in Korean Patent Laid-Open No. 10-2013-0015113 or the like designed by the present applicant, which is hereby incorporated by reference.

Meanwhile, a plurality of dams 10a, 10b and 10c are formed in a middle area MA between the pad area PA where the pads 30 are formed and the display area AA where the organic light emitting element is formed. The dams 10a, 10b and 10c prevent the liquid polymer from permeating the pad area PA during formation of the organic film 24 of the encapsulation layer 20.

The dam 10 may be made of an organic material constituting the banks BA and the spacers SP formed in the display area AA. In this case, the dams 10 are formed together with the banks BA or the spacer SP in the same process. In addition, the dam 10 may be made of a metal constituting the TFTs, for example, the same material as the gate, source and drain electrodes. In this case, the dam 10 is formed during the formation of TFTs.

As such, the dam 10 may be made of the same material as at least one of an organic material constituting the banks BA and spacer SP and a metal material constituting TFTs. Accordingly, a separate process or apparatus for forming the dam 10 is not needed.

Figure 6:
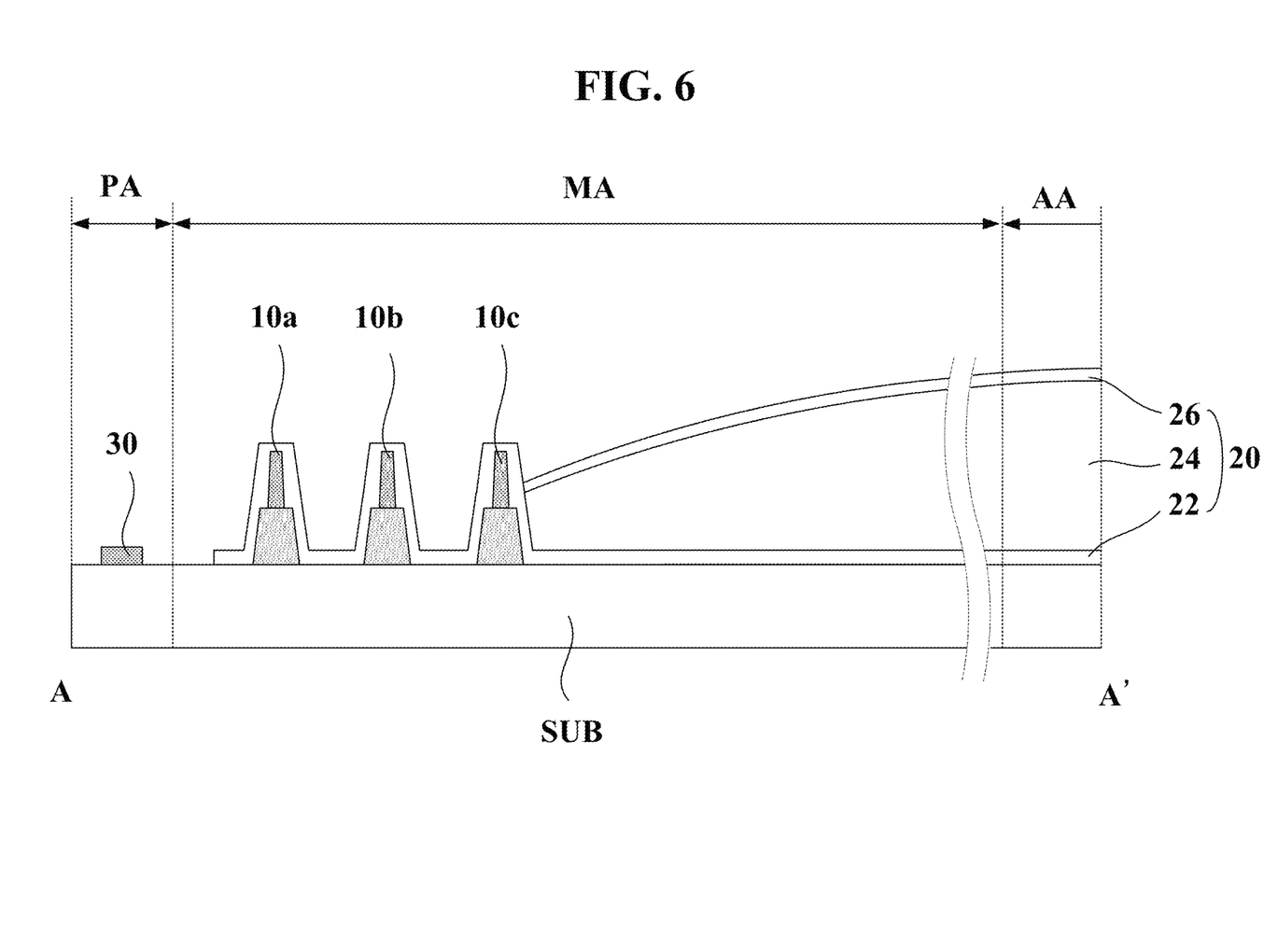
FIG. 6 is a sectional view taken along line A-A' of FIG. 4.

Meanwhile, as shown in FIG. 6, the dam 10 may have a multi-layer structure formed by laminating the selected materials. For example, the dam 10 may have a double layer structure formed by laminating materials used for the bank formation process and the spacer formation process.

Hereinafter, the dam 10 according to embodiments of the present invention will be described in detail.

Figure 7A:
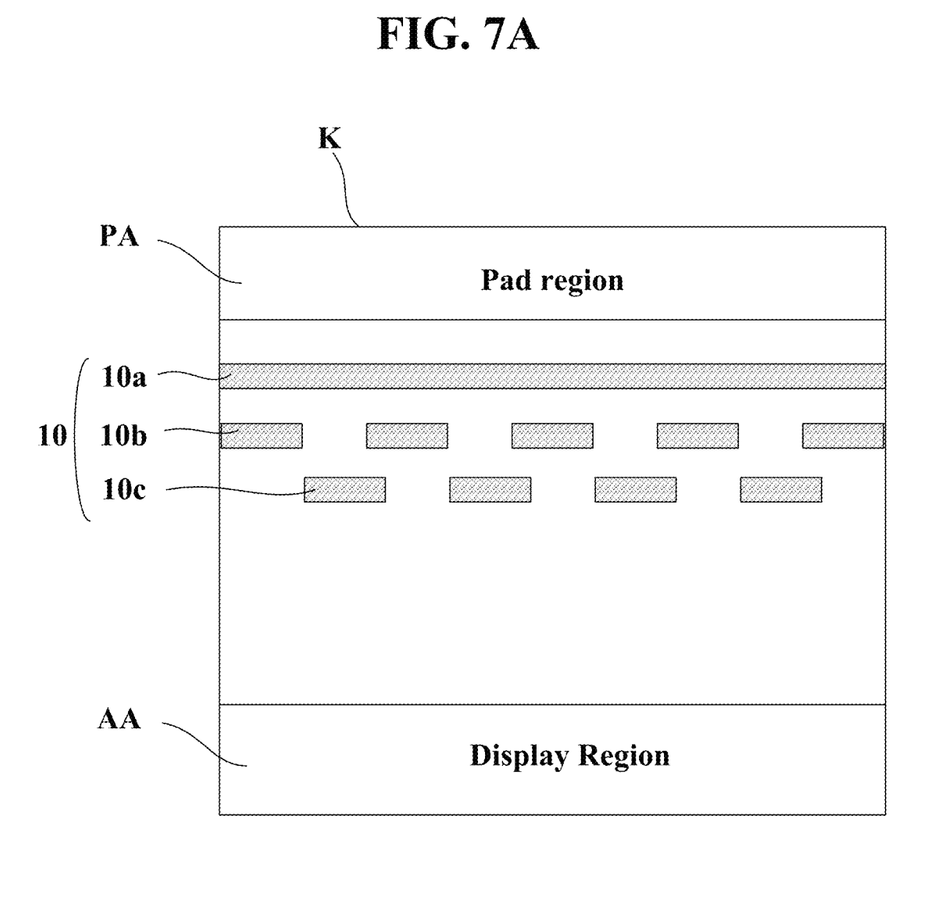
FIGS. 7A and 7B are enlarged plan views illustrating a dam according to another embodiment of the present invention.
Figure 7B:
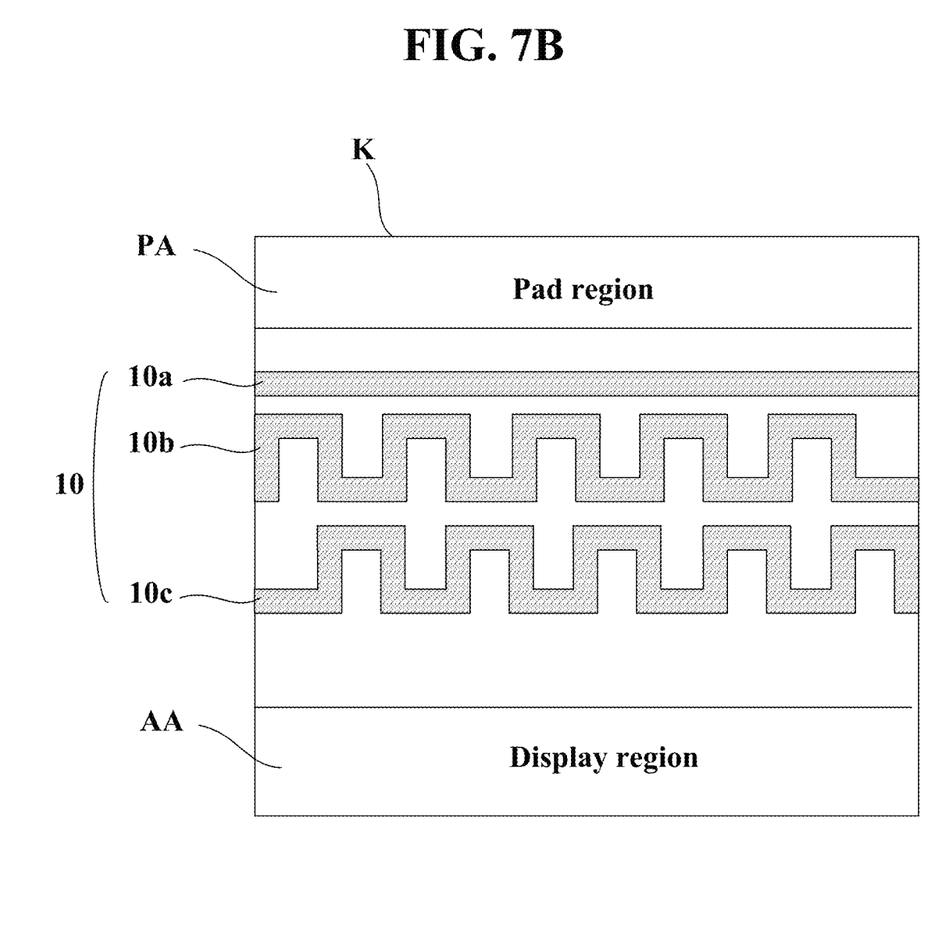

FIGS. 7A and 7B are enlarged plan views illustrating a dam according to another embodiment of the present invention.

In FIG. 4, the dam 10 is shown as a solid line, but the shape of the dam 10 may be varied. Specifically, the dam 10 may have a shape selected from a solid line, a dotted line and a zigzag.

As shown in FIG. 7A, when the plurality of dams 10a, 10b and 10c are provided, the outermost one 10a of the dams 10a, 10b and 10c is formed as the solid line and the remaining dams 10b and 10c are formed as the dotted line.

In addition, as shown in FIG. 7B, the outermost one 10a of the dams 10a, 10b and 10c is formed as the solid line and the remaining dams 10b and 10c are formed as the zigzag shape.

Figure 8:
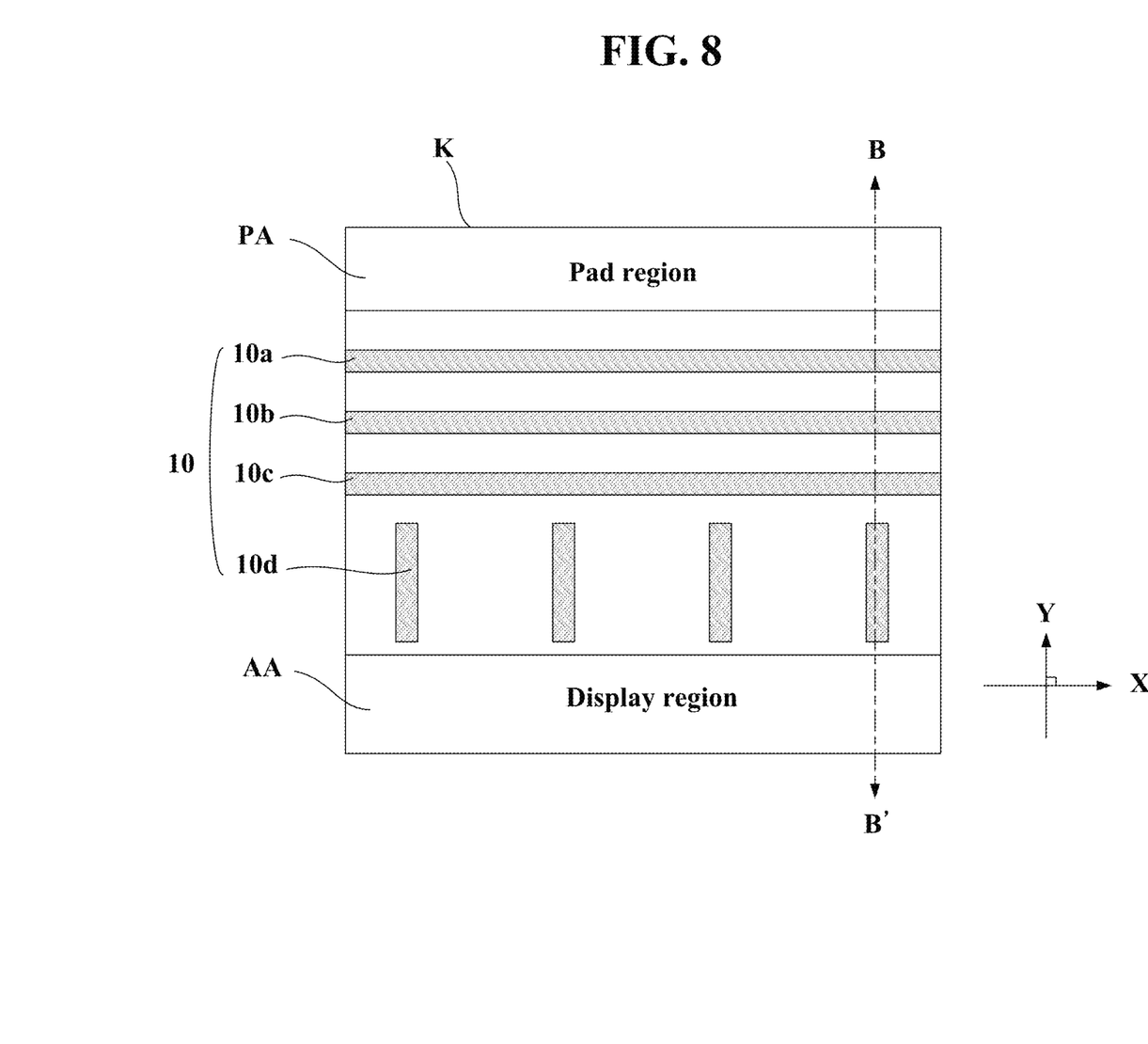
FIG. 8 is an enlarged plan view illustrating a dam according to another embodiment of the present invention.
Figure 9:
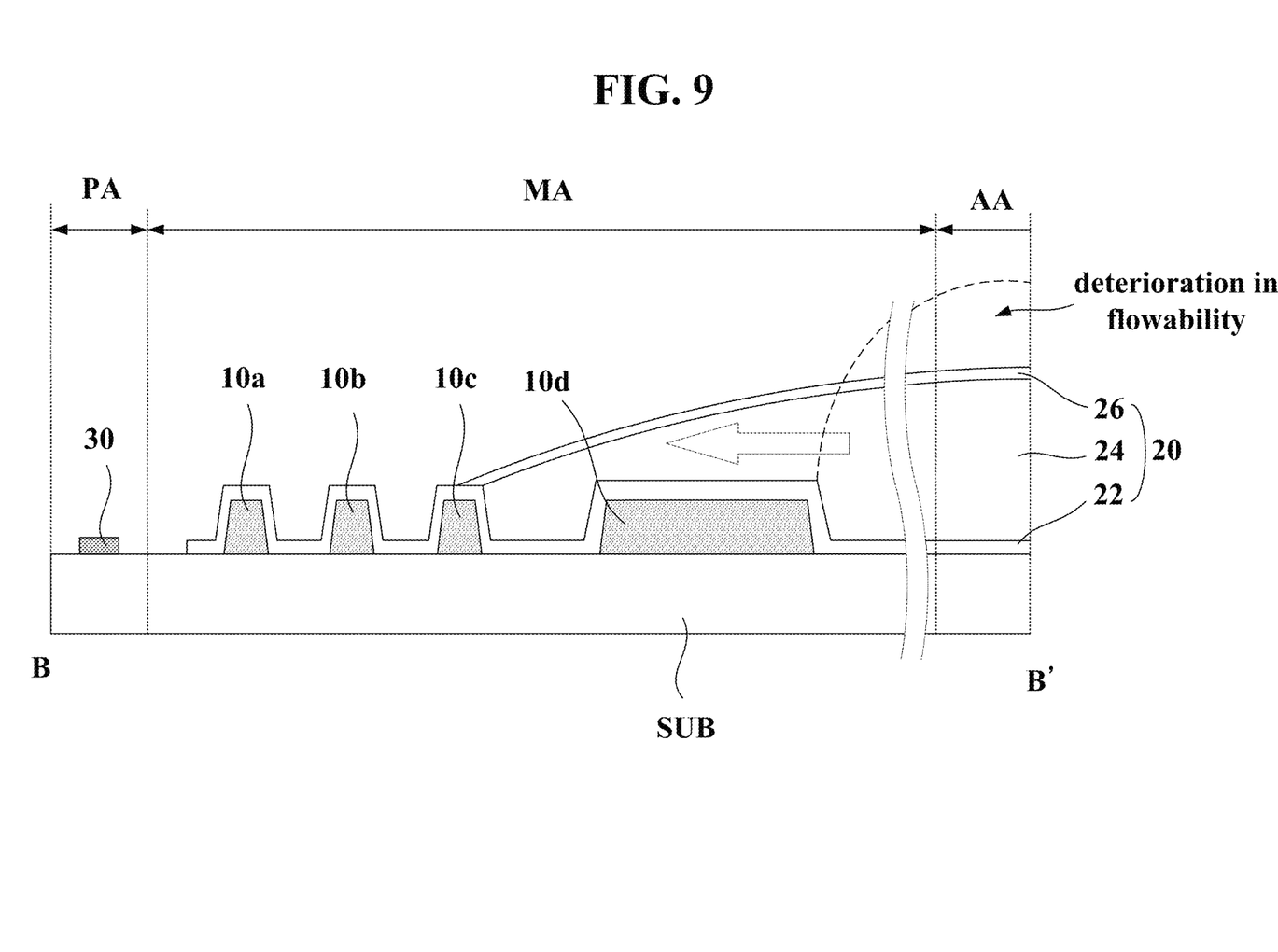
FIG. 9 is a sectional view taken along line B-B' of FIG. 8.

FIG. 8 is an enlarged plan view illustrating a dam according to another embodiment of the present invention. FIG. 9 is a sectional view taken along line B-B' of FIG. 8.

With reference to FIGS. 8 and 9, a plurality of dams 10a, 10b, 10c and 10d are formed in the middle area MA between the pad area PA where the pads 30 are formed and the display area AA where the organic light emitting element is formed.

Among the dams 10a, 10b, 10c and 10d, the dams 10a, 10b and 10c formed in relatively outer regions are formed in a first direction (x direction of FIG. 8) crossing the display area AA and the pad area PA. The dams 10a, 10b and 10c function to prevent the liquid polymer from permeating the pad area PA upon formation the organic film 24 of the encapsulation layer 20.

The closest one 10d of the dams 10a, 10b, 10c and 10d to the display area AA includes a plurality of sub-dams spaced from one another by a predetermined distance in the first direction and each sub-dam is formed in a second direction (Y direction of FIG. 8, longitudinal direction) crossing the first direction. Upon formation of the organic film 24 of the encapsulation layer 20, the dam 10d functions to induce a liquid polymer to flow to the periphery of the substrate SUB when flowability of the polymer is deteriorated, as shown by the dotted line in FIG. 9. Accordingly, a thickness difference of the organic film 24 due to deterioration in flowability of the liquid polymer upon formation of the organic film 24 of the encapsulation layer 20 can be prevented, thereby preventing blurring.

As such, the liquid polymer can be prevented from permeating the pad area PA upon formation of the organic film 24 constituting the encapsulation layer 20 by forming dams at the periphery of the substrate SUB. In addition, the dam 10 induces the liquid polymer to flow toward the periphery when flowability of the liquid polymer is deteriorated, thereby preventing blurring caused by the thickness difference of the organic film.

As apparent from the foregoing, dams may be formed at the periphery of the substrate SUB in an outer region of the substrate SUB, thereby preventing the liquid polymer from permeating the pad area PA upon formation of the organic film 24 constituting the encapsulation layer 20. In addition, the dam 10 induces the liquid polymer to flow to the periphery when flowability of the liquid polymer is deteriorated, thereby preventing blurring caused by the thickness difference of the organic film.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode (OLED) display device, comprising:
    a substrate comprising an active area and a non-active area outside the active area;
    an organic light emitting element on the active area;
    a plurality of pads on the non-active area at one outer side of the active area;
    a dam on the non-active area and including a plurality of dam portions between the plurality of pads and the one outer side of the active area, the dam completely surrounding an entirety of the active area at a periphery of the active area, and configured as a barrier to a flow of a polymer; and
    an encapsulation layer comprising a first inorganic film and the polymer on the first inorganic film, and covering the organic light emitting element, the first inorganic film covering the active area and the dam,
    wherein the first inorganic film directly contacts an entirety of a side surface of the dam facing the one outer side of the active area, and
    wherein the plurality of dam portions are spaced from one another by a predetermined distance, are disposed only at the one outer side of the active area, and define a plurality of closed regions, each of the plurality of dam portions having a zigzag shape.

2. The organic light emitting diode display device of claim 1, wherein the dam comprises a same material as a bank, a metal layer, or a spacer included in the organic light emitting element.

3. The organic emitting diode display device of claim 1, wherein the dam comprises a first layer having the same material as the bank and a second layer on the first layer and having the same material as the spacer.

4. The organic emitting diode display device of claim 3, wherein a width of the first layer is wider than a width of the second layer.

5. The organic emitting diode display device of claim 1, wherein the encapsulation layer further comprises a second inorganic film on the polymer, the first inorganic film extending over at least one of the plurality of dam portions.

6. An organic light emitting diode (OLED) display device, comprising:
    a substrate comprising at least one bank and at least one spacer on an active area, and a plurality of pads on a non-active area at one outer side of the active area;
    an encapsulation layer comprising a first inorganic film, a second inorganic film, and an organic film sealed between the first inorganic film and the second inorganic film, the encapsulation layer covering the at least one bank and the at least one spacer; and a dam including a plurality of dam portions between the one outer side of the active area and the plurality of pads, and comprising a same material as the at least one bank and the at least one spacer, the dam completely surrounding an entirety of the active area at a periphery of the active area and configured as a barrier to a flow of the organic film from the active area, wherein the first inorganic film covers the dam, and directly contacts a side surface of the dam facing the active area at a base of the dam, and wherein the plurality of dam portions are spaced from one another by a predetermined distance, are disposed only at the one outer side of the active area, and define a plurality of closed regions, each of the plurality of dam portions having a zigzag shape.

7. The organic light emitting diode display device of claim 6, wherein the plurality of dam portions comprise a first layer and a second layer on the first layer, a width of the first layer being wider than a width of the second layer on the first layer.

8. The organic light emitting diode display device of claim 6, wherein the first inorganic film covers the active area and extends over the plurality of dam portions.

9. An organic light emitting diode (OLED) display device, comprising:
  a substrate comprising an active area and a non-active area outside the active area;
  an organic light emitting element on the active area of the substrate;
  a dam on the non-active area and including a plurality of dam portions at one outer side of the active area, the dam completely surrounding an entirety of the active area at a periphery of the active area and configured as a barrier to a flow of an organic film from the active area; and
  an encapsulation layer comprising a first inorganic film, the organic film on the first inorganic film, and a second inorganic film on the organic film, the encapsulation layer covering the organic light emitting element, and the first inorganic film covering the active area and extending over the dam,
  wherein the first inorganic film covers the dam, and directly contacts a side surface of the dam facing the active area at a base of the dam, and
  wherein the plurality of dam portions are spaced from one another by a predetermined distance and are only at the one outer side of the active area, each of the plurality of dam portions having a zigzag shape.

10. The organic light emitting diode display device of claim 9, wherein the plurality of dam portions comprise a same material as a bank, a metal layer and a spacer included in the organic light emitting element.

11. The organic light emitting diode display device of claim 10, wherein the plurality of dam portions comprise a first layer and a second layer on the first layer.

12. The organic light emitting diode display device of claim 11, wherein a width of the first layer is wider than a width of the second layer.

* * * * *